United States Patent
Hallen

(10) Patent No.: US 6,356,154 B1
(45) Date of Patent: Mar. 12, 2002

(54) FET-BASED, LINEAR VOLTAGE-CONTROLLED RESISTOR FOR WIDE-BAND GAIN CONTROL CIRCUIT

(75) Inventor: Thor Hallen, Beaverton, OR (US)

(73) Assignee: Credence Systems Corporation, Fremont, CA (US)

( * ) Notice: Subject to any disclaimer, the term of this patent is extended or adjusted under 35 U.S.C. 154(b) by 0 days.

(21) Appl. No.: 09/611,358

(22) Filed: Jul. 6, 2000

(51) Int. Cl.[7] .................................................. H03F 3/45
(52) U.S. Cl. .................................... 330/254; 330/300
(58) Field of Search ................................ 330/252, 253, 330/254, 300; 257/536

(56) References Cited

U.S. PATENT DOCUMENTS

| | | | | |
|---|---|---|---|---|
| 5,107,146 A | * | 4/1992 | El-Ayat | 307/465 |
| 5,424,589 A | * | 6/1995 | Dobbelaere et al. | 326/41 |
| 5,455,816 A | * | 10/1995 | Bitting | 330/254 |
| 5,510,738 A | * | 4/1996 | Gorecki et al. | 330/254 |
| 5,990,743 A | * | 11/1999 | Gabara | 330/253 |
| 6,049,229 A | * | 4/2000 | Manohar et al. | 330/253 |

* cited by examiner

*Primary Examiner*—Robert Pascal
*Assistant Examiner*—Khanh V. Nguyen
(74) *Attorney, Agent, or Firm*—Daniel J. Bedell; Smith-Hill and Bedell

(57) ABSTRACT

A gain control circuit for generating a differential output signal in response to a differential input signal with a gain controlled by an input control signal employs two asymmetric field effect transistors (FETs) as a linear, voltage-controlled resistor. The FETs are interconnected drain-to-source with the control signal being applied to their gates so that their combined channel current is a substantially linear and symmetric function of the input control signal voltage. The gain control circuit includes two bipolar transistors, with the differential input signal being applied across their bases and the differential output signal being developed across their collectors. A resistor links the emitters of the two transistors, sources are applied to the emitters, and a pair of resistors links each collector to a source of bias voltage. The FET-based voltage-controlled resistor may be connected either between the collectors or between the emitters of the two transistors. When connected between the collectors, output signal distortion due to any input signal common mode component is reduced.

30 Claims, 3 Drawing Sheets

US 6,356,154 B1

FET-BASED, LINEAR VOLTAGE-CONTROLLED RESISTOR FOR WIDE-BAND GAIN CONTROL CIRCUIT

BACKGROUND OF THE INVENTION

1. Field of the Invention

The present invention relates in general to the use of field effect transistors (FETs) as voltage-controlled resistors in gain control circuits, and in particular to the use of an FET-based voltage-controlled resistor in a continuously variable wide-band gain control circuit.

2. Description of Related Art

A voltage-controlled resistor has a resistance that can be adjusted by an input control signal. Normally we want the current conducted by a voltage-controlled resistor be a linear function of the voltage across its load terminals. Thus while we want its resistance to be function of the voltage of a control signal applied to its control terminals, we do not want its resistance to vary with the voltage across its load terminals. Field effect transistors, particularly those fabricated using an "interdigitated" geometry, have long been used as voltage-controlled resistors because they exhibit a linear relationship between drain current $I_d$ and drain-to-source voltage $V_{ds}$ over a limited range of drain-to-source voltage. Since the conductance of an FET's channel region is a function of the gate-to-source voltage, a control signal applied to the gate of an FET effectively controls the drain-to-source resistance.

In fabricating an interdigitated FET, a linear gate stripe is diffused into a linear channel stripe with identical parallel drain and source contacts on each edge of the channel stripe. Such FETs are highly symmetrical since the drain and the source are substantially identical. Thus such an FET has the same response characteristics regardless of the polarity of $V_{ds}$ and direction of flow of $I_d$. This makes an interdigitated FET very useful as a voltage-controlled resistor in differential circuits where current flows in either direction; the drain current $I_d$ remains linear despite the polarity of $V_{ds}$.

Figure 1:
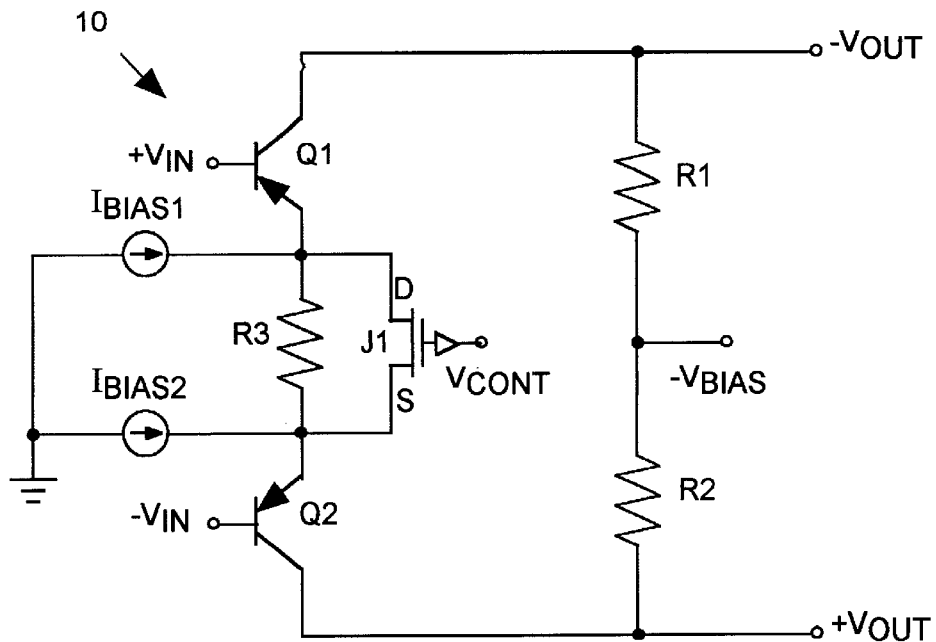

Thus such voltage-controlled FET resistors are commonly used in differential gain control circuits. FIG. 1 illustrates a well-known prior art differential gain control circuit 10 employing an FET transistor J1 as a voltage-controlled resistor. A differential input signal $V_{IN}$ is applied across the bases of two bipolar transistors Q1 and Q2 and a differential output signal appears across the collectors of transistors Q1 and Q2. A pair of matching resistors R1 and R2 are connected in series across the collectors of transistors Q1 and Q2 and a bias voltage $-V_{BIAS}$ is applied to the node between the two resistors R1 and R2. A resistor R3 and the drain-source channel of the FET transistor J1 link the emitters of transistors Q1 and Q2. A pair of current sources $I_{BIAS1}$ and $I_{BIAS2}$ supply bias currents to the emitters of transistors Q1 and Q2.

The gain G of control circuit 10 is determined as follows:

$$G = (R1+R2)/(R3\|Rx)$$

where Rx is the drain-to-source resistance of FET J1 and the quantity (R3‖Rx) is the resistance of the parallel combination of R3 and RX, the quantity (R3Rx)/(R3+Rx). The voltage of a control signal $V_{CONT}$ applied to the gate of FET J1 controls the drain-to-source resistance Rx. By increasing the voltage of $V_{CONT}$ we decrease the drain-to-source resistance Rx, thereby increasing the gain of circuit 10. To avoid signal distortion it is necessary for the impedance between the emitters of transistors Q1 and Q2 to be independent of the voltage across those emitters. That is why transistor J1 is implemented as a FET, an in particular a symmetric FET.

Gain control circuit of FIG. 1 has some significant limitations. First, the FET drain-to-source channel may have significant parasitic capacitance in parallel with the channel conductance, and the parasitic capacitance can cause signal distortion in output signal $V_{OUT}$ through over-peaking.

Another problem arises when the input signal $V_{IN}$ has a non-zero common mode voltage. The common mode voltage of the $V_{IN}$ differential input signal is the average voltage of its $+V_{IN}$ and $-V_{IN}$ ends. Once we set the gain of FET J1 by adjusting the voltage of control signal $V_{CONT}$, we don't want that gain to change. In particular, we don't want the gain to be a function of the polarity of drain-to-source voltage $V_{ds}$. However when the common mode input signal voltage is non-zero, the gate-to-source voltage $V_{gs}$ will be modulated by $V_{IN}$ and the channel resistance Rx of FET J1 will vary with every cycle of the $V_{IN}$ signal, thereby causing gain compression for one polarity of the input signal and gain expansion for the opposite polarity of the input signal. This asymmetry in response produces second order harmonic distortion in of the output signal $V_{OUT}$. A similar second order harmonic distortion in the output signal occurs when gain control circuit 10 is driven by a single-ended signal.

A symmetric FET is generally suitable for only relatively low frequency operation; high frequency FETs are typically asymmetric, but are not used as voltage-controlled resistors in differential gain control circuits because their asymmetry creates substantial harmonic distortion. Thus when we want to provide a gain control circuit in a high frequency integrated circuit employing asymmetric FETs in other circuits, providing a symmetric FET for the gain control circuit becomes problematic.

What is needed is a voltage-controlled resistor for use in a differential gain control circuit that can be implemented using high frequency, asymmetric FETs without substantially distorting the output signal. It would also be beneficial if the gain control circuit could use such an FET-based voltage-control resistor in a manner that avoids second order distortion resulting from an input signal having a non-zero common mode voltage.

SUMMARY OF THE INVENTION

A gain control circuit in accordance with one aspect of the invention generates a differential output signal in response to a differential input signal with a gain controlled by an input control signal employs two asymmetric field effect transistors (FETs) as a linear, voltage-controlled resistor. The use of asymmetric FETs to implement a linear voltage-controlled resistor makes the gain control circuit of the present invention convenient to use in high-frequency integrated circuit applications employing asymmetrical FETs.

In accordance with a second aspect of the invention, the FETs are interconnected drain-to-source with the control signal being applied to their gates. This results in a combined channel current that is a substantially linear and symmetric function of the input control signal voltage applied to the FET's gates.

In accordance with a third aspect of the invention, the gain control circuit includes two bipolar transistors, with the differential input signal being applied across their bases and the differential output signal being developed across their collectors. A resistor links the emitters of the two transistors, current sources are applied to the emitters, and a pair of resistors links each collector to a source of bias voltage.

In accordance with a fourth aspect of the invention, in a first embodiment thereof, the FET-based voltage-controlled resistor is connected between the emitters of the two transistors.

In accordance with a fifth aspect of the invention, in a second embodiment thereof, the FET-based voltage-controlled resistor is connected between the collectors of the two bipolar transistors, thereby reducing output signal distortion due to any input signal common mode component.

In accordance with a sixth aspect of the invention, the gain control circuit drives an emitter-follower output stage. The inherent drain-to-source parasitic capacitance of the two FETs reduces over-peaking distortion in the output signal of emitter-follower stage when the FETs are connected between the collectors of the two bipolar transistors.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

Figure 2:
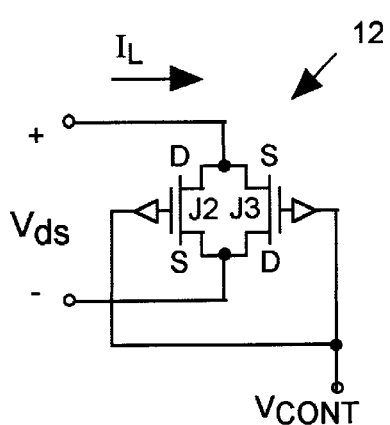
Figure 3:
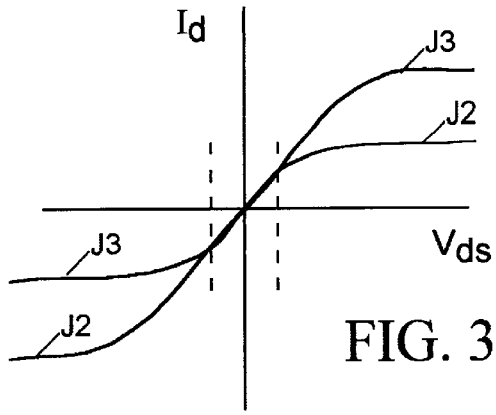

FIG. 1 illustrates a prior art differential gain control circuit employing an FET transistor as a voltage-controlled resistor, FIG. 2 illustrates an FET-based voltage-controlled resistor in accordance with the invention, FIG. 3 is a graph of the drain currents of the FET transistors of FIG. 2 as functions of drain-to-source voltage.

Figure 4:
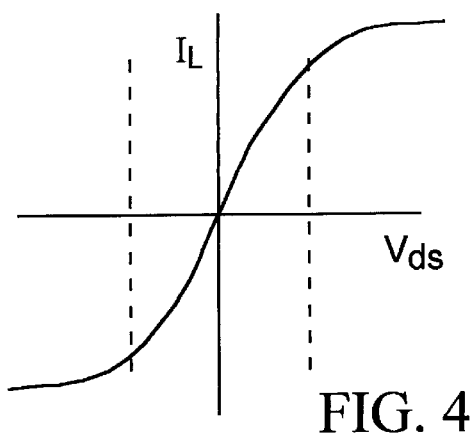
Figure 5:
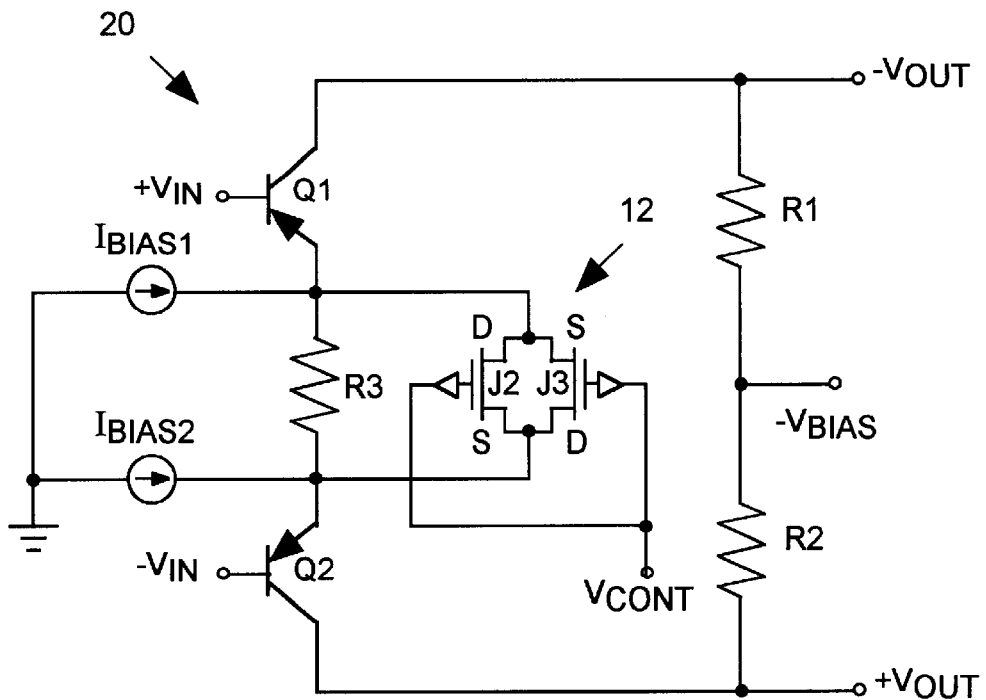
Figure 6:
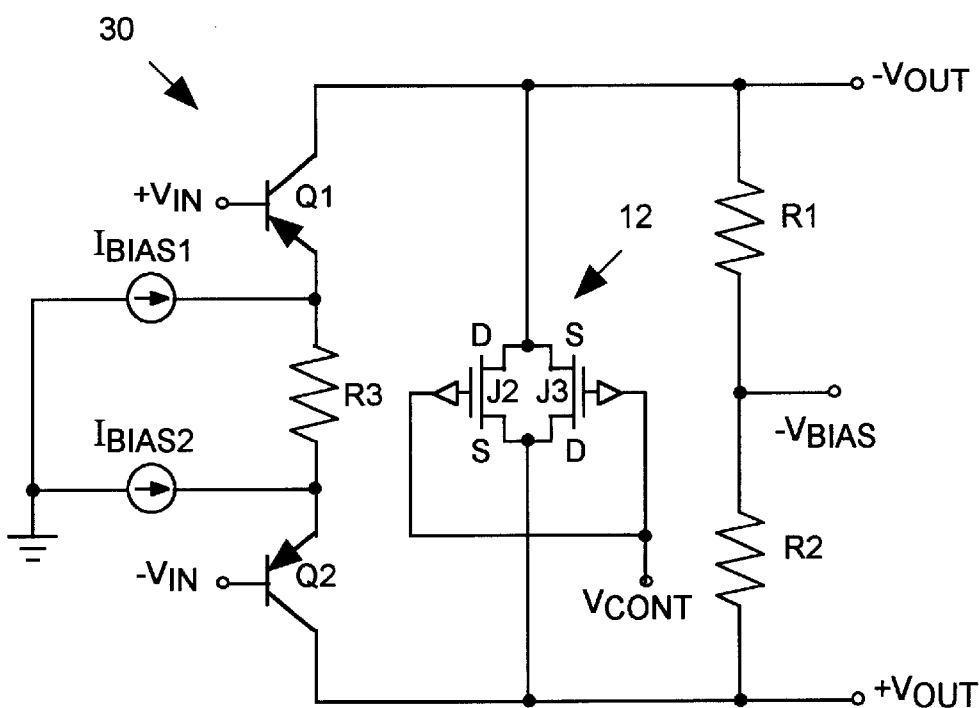
Figure 7:
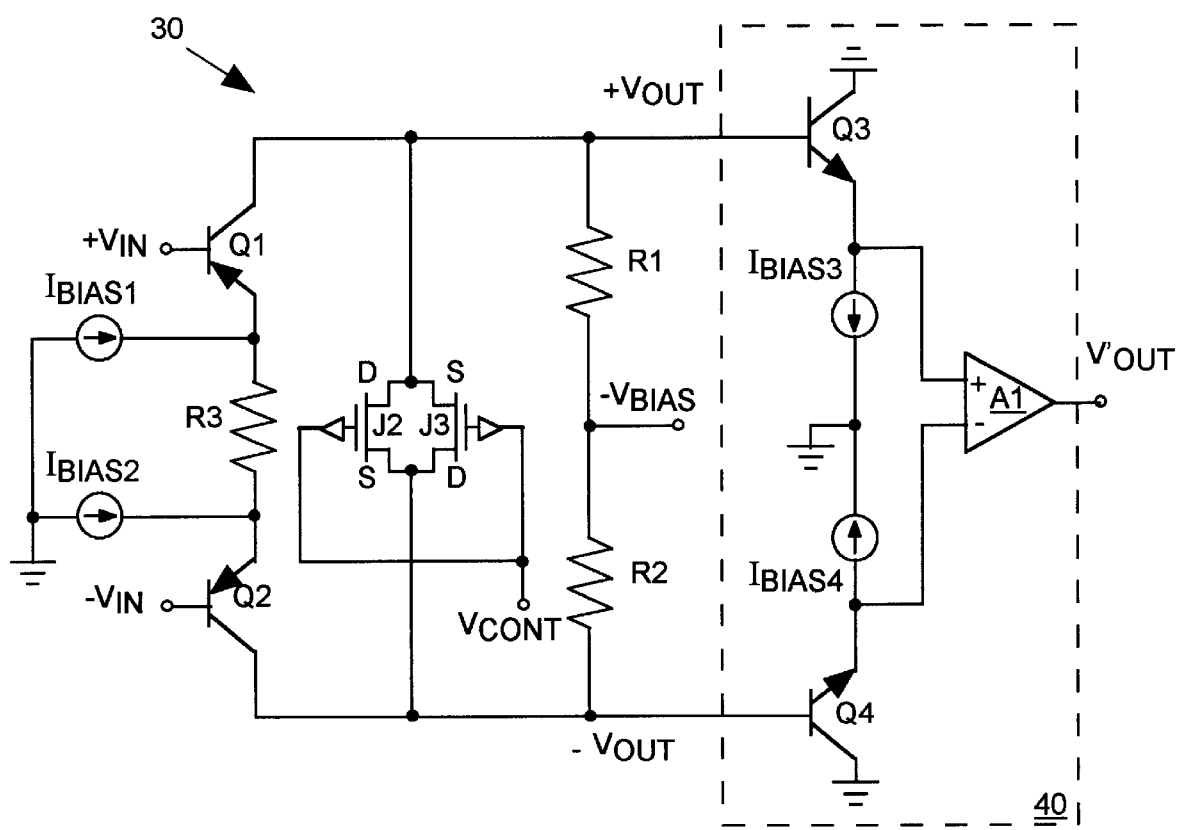

FIG. 4 illustrates the load current conveyed by the FET transistors of FIG. 2 as a function drain-to-source voltage, FIGS. 5 and 6 illustrate differential gain control circuits in accordance with the invention employing the dual-FET, voltage-controlled resistor of FIG. 2, FIG. 7 illustrates a differential gain control circuit in accordance with the invention employing the dual-FET, voltage-controlled resistor of FIG. 2 and driving an emitter-follower output stage.

DESCRIPTION OF THE PREFERRED EMBODIMENT(S)

Dual FET Voltage-controlled Resistor

As illustrated in FIG. 2, a voltage-controlled resistor 12 in accordance with the invention is formed by two similar asymmetric field effect transistors (FETs) J2 and J3 connected drain-to-source. A control signal $V_{CONT}$ applied to the gates of FETs J2 and J3 controls their channel conductance, thereby controlling the relationship between a load current $I_L$ flowing through FETs J2 and J3 and a voltage $V_{ds}$ applied across their drain and sources terminals.

FIG. 3 plots of the drain currents $I_d$ of asymmetric transistors J2 and J3 as functions of $V_{ds}$ for some fixed voltage magnitude of control signal $V_{CONT}$. We can see that the relationship between $I_d$ and $V_{ds}$ for each FET J2 and J3 is both linear and symmetrical, but only over a relatively narrow range of $V_{ds}$ about the $V_{ds}=0$ axis.

FIG. 4 illustrates the load current $I_L$ of FIG. 2, the sum of the drain currents $I_d$ of transistors J2 and J3, as a function of $V_{ds}$ for some fixed value of $V_{gs}$. Note that $I_L$ is both a symmetric and substantially linear function of $V_{ds}$ over a much wider range of $V_{ds}$ than the drain current of either FET J2 or J3, particularly when FETs J2 and J3 are inherently asymmetric. Thus by combining two asymmetric FETs in the manner illustrated in FIG. 2, we obtain a structure that acts like a symmetric FET having a substantially linear load current $I_L$ behavior over a relative wide range of drain-to-source voltage $V_{ds}$.

FETs employed in high frequency applications are often fabricated with "ring dot" geometries in which a gate is a circular stripe diffused into a circular channel, the source contact is a circular ring around the outside of the channel, and the drain is a "dot" connection of the inside of the circuit channel. A ring dot FET is an asymmetrical device because its drain and source are asymmetrical. Thus a single ring dot FET would not be a good choice for use as a linear voltage-controlled resistor in a differential circuit where currents can flow in either direction through the resistor. However if we employ two such ring dot FETs to form a voltage-controlled resistor 12 in the manner illustrated in FIG. 2, that resistor can be effectively used in a differential circuit because, as illustrated in FIG. 4, its load current $I_L$ is a substantially linear and symmetric function of $V_{ds}$ about the $V_{ds}=0$ axis.

Differential Gain Control Circuit Employing Dual FET Voltage-controlled Resistor FIG. 5 illustrates a differential gain control circuit 20 in accordance with the invention employing the dual-FET, voltage-controlled resistor 12 of FIG. 2. Note that gain control circuit 20 of FIG. 5 is generally similar to prior art gain control circuit 10 of FIG. 1 except that the single FET J1 resistor of FIG. 1 has been replaced with the dual-FET voltage-controlled resistor 12 of FIG. 2. Both gain control circuits produce a differential output signal $V_{OUT}$ in response to a differential input signal $V_{IN}$ with a gain controlled by an input control signal $V_{CONT}$. As in prior art gain control circuit 10 of FIG. 1, gain control circuit 20 includes an PNP bipolar transistor Q1, a pnp bipolar transistor Q2, a pair of matching resistors R1 and R2 connected in series across the collectors of transistors Q1 and Q2, a resistor R3 connected between the emitters of transistors Q1 and Q2, current sources $I_{BIAS1}$ and $I_{BIAS2}$ supplying bias currents to the emitters of transistors Q1 and Q2, and a negative bias voltage source $-V_{BIAS}$ connected to the junction between resistors R1 and R2.

The gain G of either gain control circuit 10 or 20 or is determined as follows:

$$G=(R1+R2)/(R3\|Rx) \qquad [1]$$

where Rx is the drain-to-source resistance of FET J1, for gain control circuit 10, or the parallel drain-to-source resistance of FETs J2 and J3, for gain control circuit 20. The quantity (R3∥Rx) is the resistance of the parallel combination of R3 and Rx, the quantity (R3Rx)/(R3+Rx). The control signal $V_{CONT}$ controls the channel conductance of FET J1 or FETs J2 and J3, and therefore the value of Rx. Thus in either gain control circuit 10 or 20, as we increase the voltage of control signal $V_{CONT}$ we decrease the drain-to-source resistance Rx, thereby increasing circuit gain.

Gain control circuit 20 is advantageous over gain control circuit 10 because FETs J2 and J3, being asymmetric, are more conveniently implemented in high frequency applications employing asymmetric FETs. The single FET J1 of prior art gain control circuit 10 cannot be a high-frequency asymmetric FET because one polarity of input signal $V_{IN}$ would cause gain compression and another polarity of the input signal would cause gain expansion, thereby producing a second order harmonic distortion in the output signal $V_{OUT}$.

Common Mode Tolerant Gain Control Circuit

FIG. 6 illustrates an improved gain control circuit 30 in accordance with an alternative embodiment of the invention. Gain control circuit 30 is generally similar to gain control circuit 20 of FIG. 5, however rather than connecting voltage-controlled resistor 12 of FIG. 2 across the emitters of transistors Q1 and Q2 as in gain control circuit 20, resistor 12 is connected across the collectors of transistors Q1 and Q2. Relocating resistor 12 to the collectors of transistors Q1 and Q2 greatly reduces output signal $V_{OUT}$ distortion arising when the input signal $V_{IN}$ has a non-zero common mode voltage. (The common mode voltage of the $V_{IN}$ differential input signal is the average voltage of its $+V_{IN}$ and $-V_{IN}$ ends.)

To avoid distortion in output signal $V_{OUT}$, we don't want circuit gain to vary with $V_{ds}$. In particular, we don't want the gain to be a function of the polarity of the drain-to-source voltage $V_{ds}$ of the FET-based variable resistor 12 controlling gain. However in the gain control circuit 20 of FIG. 5 (or in the prior art gain control circuit 10 of FIG. 1), when the common mode input signal voltage is non-zero, the gate-to-source voltage $V_{gs}$ will be modulated by $V_{IN}$, and the channel resistance Rx of FETs J2 and J3 (or FET J1) will vary with every cycle of the $V_{IN}$ signal, thereby causing gain compression for one polarity of the input signal and gain expansion for the opposite polarity of the input signal. This asymmetry in response produces second order harmonic distortion in output signal $V_{OUT}$. A similar second order harmonic distortion in the output signal occurs when gain control circuit 10 is driven by a single-ended signal.

Since the emitters of transistors Q1 and Q2 of FIGS. 1, 5 and 6 are biased by high impedance current sources $I_{BIAS1}$ and $I_{BIAS2}$, the common mode component of the $V_{IN}$ signal is not propagated to the collectors of transistors Q1 and Q2. Thus when FETs J2 and J3 of FIG. 5 are relocated to the collectors of transistors Q1 and Q2 as illustrated in FIG. 6, the common mode input signal no longer modulates the stage gain, and the harmonic distortion in output signal $V_{OUT}$ resulting from such stage gain modulation is substantially eliminated.

Referring to FIG. 1, FET J1 of prior art gain control circuit 10 is located at the emitters of transistors Q1 and Q2 because the single, symmetric FET J1 has a linear and symmetric $I_d$-$V_{ds}$ relationship over only a relatively small positive and negative range of $V_{ds}$, and because the signal developed between the emitters of transistors Q1 and Q2 has a relatively narrow range. If we were to relocate FET J1 to the collectors of transistors Q1, the relatively wide range of the $V_{OUT}$ signal would drive FET J1 outside its linear, symmetric range, and the $V_{OUT}$ signal would be substantially distorted.

However when we combine two FETs J2 and J3 as illustrated in FIG. 2, the resulting voltage-controlled resistor has a relatively wide linear range as illustrated in FIG. 4. Thus we can relocate FETs J2 and J3 of FIG. 5 to the collectors of transistors Q1 and Q2 as illustrated in FIG. 6 because they collectively provide a much wider range of $V_{ds}$ for which $I_d$ is linear and symmetric, even when FETs J2 and J3 are implemented by asymmetric FETs such as ring dot FETs. Gain control circuit 30 of FIG. 10 therefore produces much less harmonic distortion in its output signal $V_{OUT}$ than the gain control circuits 10 and 20 of FIGS. 1 and 5 when $V_{IN}$ is single-ended or has a non-zero common mode voltage.

Gain Control Circuit With Emitter-Follower Stage

FIG. 7 illustrates the gain control circuit 30 of FIG. 6 driving a conventional emitter-follower output stage 40 producing a signal-ended output signal $V'_{OUT}$ in response to differential output signal $V_{OUT}$ of gain control circuit 30. Output stage 6 includes a pair of bipolar transistors Q3 (NPN) and Q4 (NPN) receiving the differential $V_{OUT}$ signal across their bases. The emitters of transistors Q3 and Q4 drive inputs of an amplifier A1 producing the single-ended $V'_{OUT}$ signal. Current sources $I_{BIAS3}$ and $I_{BIAS4}$ provide bias currents at the emitters of Q3 and Q4.

The channels of the FETs connected across the emitters of transistors Q1 and Q2 of the gain control circuits of FIGS. 1 and 5 can have a significant parasitic capacitance in parallel with their channel conductance. That parasitic capacitance causes over-peaking distortion in the $V_{OUT}$ signal. A common problem of an emitter-follower stage driving a capacitive load is an under-damped, over-peaked response. When we relocate FETs J2 and J3 to the collectors of transistors Q1 and Q2 as in gain control circuit 30, the shunt capacitance provided by FETs J2 and J3 across the bases of transistors Q3 and Q4 reduces over-peaking distortion in the $V'_{OUT}$ signal of emitter-follower stage 40. Thus while the parasitic capacitance of FETs J2 and J3 increases output signal distortion when connected across the emitters of transistors Q1 and Q2 as in gain control circuit 20 of FIG. 5, the parasitic capacitance of FETs J2 and J3 reduces distortion in the $V'_{OUT}$ signal when connected across the collectors of transistors Q1 and Q2.

Thus has been shown and described alternative embodiments of gain control circuits in accordance with the invention employing two drain-to-source connected FETs as a linear, voltage-controller variable resistor. While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An apparatus for conducting a load current in response to an input signal, the apparatus having a resistance controlled by an input control signal, the apparatus comprising:
   a first circuit node;
   a second circuit node, the input signal being applied across the first and second circuit nodes;
   a third circuit node receiving the input control signal;
   a first field effect transistor (FET) having a drain connected to the first circuit node, a source connected to the second circuit node, and a gate connected to the third circuit node; and
   a second FET having a drain connected to the second circuit node, a source connected to the first circuit node, and a gate connected to the third circuit node,
   wherein said first and second FETs conduct said load current between said first and second circuit nodes, and
   wherein said first and second FETs are substantially similar.

2. The apparatus in accordance with claim 1 wherein said first and second FETs are substantially asymmetric FETs such that said load current is a function of both magnitude and polarity of said input signal.

3. The apparatus in accordance with claim 2 wherein said first and second FETs are ring dot FETs.

4. An apparatus for generating a differential output signal in response to a differential input signal with a gain controlled by an input control signal, the apparatus comprising:
   a first circuit node;
   a second circuit node;
   a third circuit node receiving the input control signal;
   a first field effect transistor (FET) having a drain connected to the first circuit node, a source connected to the second circuit node, and a gate connected to the third circuit node;
   a second FET having a drain connected to the second circuit node, a source connected to the first circuit node, and a gate connected to-the third circuit node;

a first transistor having an emitter connected to said first circuit node, and having a base and a collector;

a second transistor having an emitter connected to said second circuit node, and having a base and a collector;

wherein said differential input signal is applied across the bases of said first and second transistors, and wherein said differential output signal is developed across the collectors of said first and second transistors.

5. The apparatus in accordance with claim 4 further comprising:

a fourth circuit node;

a first resistor connected between the collector of said first transistor and said fourth circuit node, a second resistor connected between the collector of said second transistor and said fourth circuit node, and a voltage source connected to said fourth circuit node.

6. The apparatus in accordance with claim 5 further comprising:

a third resistor connected between said first and second circuit nodes, a first current source connected to said first circuit node, and a second current source connected to said second circuit, node.

7. The apparatus in accordance with claim 4 wherein said first and second FETs are substantially similar.

8. The apparatus in accordance with claim 7 wherein said first and second FETs are substantially asymmetric FETs.

9. The apparatus in accordance with claim 8 wherein said first and second FETs are ring dot FETs.

10. The apparatus in accordance with claim 6 wherein said first and second FETs are substantially similar.

11. The apparatus in accordance with claim 10 wherein said first and second FETs are substantially asymmetric FETs.

12. The apparatus in accordance with claim 11 wherein said first and second FETs are ring dot FETs.

13. A apparatus for generating a differential output signal in response to a differential input signal with a gain controlled by an input control signal, the apparatus comprising:

a first circuit node;

a second circuit node;

a third circuit node receiving the input control signal;

a first field effect transistor (FET) having a drain connected to the first circuit node, a source connected to the second circuit node, and a gate connected to the third circuit node;

a second FET having a drain connected to the second circuit node, a source connected to the first circuit node, and a gate connected to the third circuit node;

a first transistor having a collector connected to said first circuit node, and having an emitter and a collector;

a second transistor having a collector connected to said second circuit node, and having a base and a collector;

wherein said differential input signal is applied across the bases of said first and second transistors, and wherein said differential output signal is developed across said first and second circuit nodes.

14. The apparatus in accordance with claim 13 further comprising:

a fourth circuit node;

a first resistor connected between the first and fourth circuit nodes, a second resistor connected between the second and fourth circuit nodes, and a voltage source connected to said fourth circuit node.

15. The apparatus in accordance with claim 13 further comprising:

a third resistor connected between the emitters of said first and second transistors, a first current source connected to the emitter of said first transistor, and a second current source connected to said emitter of said second transistor.

16. The apparatus in accordance with claim 13 wherein said first and second FETs are substantially similar.

17. The apparatus accordance with claim 16 wherein said first and second FETs are substantially asymmetric FETs.

18. The apparatus in accordance with claim 17 wherein said first and second FETs are ring dot FETs.

19. The apparatus in accordance with claim 14 further comprising:

a third resistor connected between the emitters of said first and second transistors, a first current source connected to the emitter of said first transistor, and a second current source connected to said emitter of said second transistor.

20. The apparatus in accordance with claim 19 wherein said first and second FETs are substantially similar asymmetric FETs.

21. The apparatus in accordance with claim 20 wherein said first and second FETs are ring dot FETs.

22. An apparatus for generating an output signal in response to a differential input signal with a gain controlled by an input control signal, the apparatus comprising:

a first circuit node;

a second circuit node;

a third circuit node receiving the input control signal;

a first field effect transistor (FET) having a drain connected to the first circuit node, a source connected to the second circuit node, and a gate connected to the third circuit node;

a second FET having a drain connected to the second circuit node, a source connected to the first circuit node, and a gate connected to the third circuit node;

a first transistor having a collector connected to said first circuit node, and having an emitter and a collector;

a second transistor having a collector connected to said second circuit node, and having a base and a collector;

a third transistor having a base connected to said first circuit node, an emitter and a collector, a fourth transistor having a base connected to said second circuit node, an emitter and a collector, an amplifier having inputs connected to the emitters of said third and fourth transistors for producing said output signal in response to voltages developed at its inputs, wherein said differential input signal is applied across the bases of said first and second transistors.

23. The apparatus in accordance with claim 22 further comprising:

a fourth circuit node;

a first resistor connected between the first and fourth circuit nodes, a second resistor connected between the second and fourth circuit nodes, and a voltage source connected to said fourth circuit node.

24. The apparatus in accordance with claim 23 further comprising:
   a third resistor connected between the emitters of said first and second transistors,
   a first current source connected to the emitter of said first transistor, and
   a second current source connected to said emitter of said second transistor.

25. The apparatus in accordance with claim 23 wherein said first and second FETs are substantially similar.

26. The apparatus in accordance with claim 25 wherein said first and second FETs are substantially asymmetric FETs.

27. The apparatus in accordance with claim 26 wherein said first and second FETs are ring dot FETs.

28. The apparatus in accordance with claim 24 further comprising:
   a third resistor connected between the emitters of said first and second transistors,
   a first current source connected to the emitter of said first transistor, and
   a second current source connected to said emitter of said second transistor.

29. The apparatus circuit in accordance with claim 28 wherein said first and second FETs are substantially similar asymmetric FETs.

30. The apparatus in accordance with claim 29 wherein said first and second FETs are ring dot FETs.

* * * * *